United States Patent
Soltanmohammadi et al.

(10) Patent No.: US 9,553,564 B1
(45) Date of Patent: Jan. 24, 2017

(54) FILTER FOR DATA RATE CONVERSION USING FEEDBACK WITH A DIFFERENT FREQUENCY

(71) Applicant: MARVELL INTERNATIONAL LTD., Hamilton (BM)

(72) Inventors: Erfan Soltanmohammadi, Campbell, CA (US); Kapil Jain, Santa Clara, CA (US)

(73) Assignee: MARVELL INTERNATIONAL LTD. (BM)

( * ) Notice: Subject to any disclaimer, the term of this patent is extended or adjusted under 35 U.S.C. 154(b) by 0 days.

(21) Appl. No.: 14/834,708

(22) Filed: Aug. 25, 2015

Related U.S. Application Data (60) Provisional application No. 62/041,926, filed on Aug. 26, 2014.

(51) Int. Cl.
  *H03H 17/04* (2006.01)
  *H03H 17/06* (2006.01)
  *H03M 5/02* (2006.01)

(52) U.S. Cl.
  CPC ..... *H03H 17/0416* (2013.01); *H03H 17/0628* (2013.01); *H03H 17/045* (2013.01); *H03M 5/02* (2013.01)

(58) Field of Classification Search
  CPC .............. H03H 17/0416; H03H 17/045; H03H 17/0628; H03M 5/02
  See application file for complete search history.

(56) References Cited

U.S. PATENT DOCUMENTS

| | | | | |
|---|---|---|---|---|
| 5,148,382 A | * | 9/1992 | Kishi | H03H 17/0461 708/306 |
| 5,641,931 A | * | 6/1997 | Ogai | G10H 1/125 84/659 |
| 5,732,002 A | * | 3/1998 | Lee | H03H 17/0444 708/313 |
| 6,747,858 B1 | * | 6/2004 | Sculley | H03H 17/0621 361/61 |
| 6,766,338 B1 | * | 7/2004 | Handley | G06F 17/17 341/61 |
| 8,725,785 B1 | * | 5/2014 | Haddadin | H03H 17/04 708/313 |
| 2008/0147761 A1 | * | 6/2008 | Melanson | H03H 17/0283 708/313 |
| 2009/0079598 A1 | * | 3/2009 | Furuta | H03H 17/0416 341/61 |

* cited by examiner

*Primary Examiner* — Sophia Vlahos (57) ABSTRACT

Systems, methods, and other embodiments associated with converting an input signal into an output signal with a different sampling rate. In one embodiment, an apparatus includes a feedforward circuit configured to receive the input signal comprised of discrete data samples with the first sampling rate and to generate a first intermediate value based, at least in part, on a feedforward coefficient and the input signal. The apparatus includes a feedback circuit configured to generate a second intermediate value that is based, at least in part, on a feedback coefficient and a predetermined number of previous samples of the output signal. The apparatus includes a signal combiner configured to combine the first intermediate value and the second intermediate value together to interpolate a data sample of the output signal at the second sampling rate. The output signal is a converted form of the input signal at the second sampling rate.

17 Claims, 4 Drawing Sheets

FILTER FOR DATA RATE CONVERSION USING FEEDBACK WITH A DIFFERENT FREQUENCY

CROSS REFERENCE TO RELATED APPLICATIONS

This patent disclosure claims the benefit of U.S. Provisional Application Ser. No. 62/041,926 filed on Aug. 26, 2014, which is hereby wholly incorporated by reference.

BACKGROUND

Sample-rate conversion (SRC) refers to the process of translating a sequence of discrete data samples with a first sampling rate into another sequence of data samples with a second sampling rate that is different from the first sampling rate. In general, when transferring data from a first device (that uses a first sampling rate) to a second device (that operates using a second sampling rate), the data needs to be converted to correspond to the second sampling rate. As an example, the first device may sample the data at 8 KHz and then the data is subsequently converted to 44.1 KHz for use by a device operating at 44.1 KHz. The data is in the form of an electronic digital signal.

Additionally, when the second sampling rate is not an integer multiple of the first sampling rate, converting the data can be complex. For example, difficulties may arise because of incorrect underlying assumptions with rate converter designs, use of large data tables that consume a large semiconductor chip area, or semiconductor processing performance inefficiencies.

SUMMARY

In general, in one aspect this specification discloses an apparatus for converting an input signal with a first sampling rate into an output signal with a second sampling rate. The apparatus includes a feedforward circuit configured to receive the input signal that is comprised of discrete data samples with the first sampling rate and to generate a first intermediate value that is based, at least in part, on a feedforward coefficient and the input signal. The apparatus includes a feedback circuit configured to generate a second intermediate value that is based, at least in part, on a feedback coefficient and a predetermined number of previous samples of the output signal. The apparatus includes a signal combiner configured to combine the first intermediate value and the second intermediate value together to interpolate a data sample of the output signal at the second sampling rate. The output signal is a converted form of the input signal at the second sampling rate.

In general, in another aspect, this specification discloses a method for converting an input signal with a first sampling rate into an output signal with a second sampling rate. The method includes receiving, by an infinite impulse response (IIR) filter, the input signal that is comprised of discrete data samples obtained with the first sampling rate. The method includes generating, by the IIR filter, a first intermediate value for estimating the output signal, wherein the first intermediate value is based, at least in part, on a feedforward coefficient and the input signal. The method includes generating, by the IIR filter, a second intermediate value that is based, at least in part, on a feedback coefficient and a predetermined number of previous samples of the output signal. The method includes interpolating, by the IIR filter, the output signal by combining the first intermediate value and the second intermediate value at the second sampling rate, wherein the output signal is a converted form of the input signal at the second sampling rate.

In general, in another aspect, this specification discloses a device. The device includes an infinite impulse response (IIR) filter. The IIR filter includes a feedforward circuit coupled to an input. An input signal with a first sampling rate is provided to the feedforward circuit on the input. The IIR filter includes a feedback circuit coupled to an output. The IIR filter includes a signal combiner coupled to the output the feedback circuit and the feedforward circuit. The signal combiner generates an output signal and provides the output signal on the output at a second sampling rate. The feedback circuit is clocked at the second sampling rate and the feedforward circuit is clocked at the first sampling rate.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa.

DETAILED DESCRIPTION

Described herein are examples of systems, methods, and other embodiments associated with converting an input signal from a first sample rate to a second sample rate using an infinite impulse response (IIR) filter. The present system and method may be used, for example, to convert audio data from one audio format to a different audio format (e.g., convert from compact disc format to digital audio tape format), or from one video format to another format. By converting the data format, the audio and/or video data may be transferred and used on a different device that uses a different sampling rate.

Briefly consider that rate converters receive an input signal which has been sampled at the first sample rate and convert the input signal into an output signal that has the second sample rate. In general, hardware components of the rate converter operate (i.e., are clocked) at a frequency equal to the first sample rate, even though the output signal generated by the rate converter has a different frequency or output rate. Because of this disparity between the operating frequency of the hardware components and the output rate, the output signal may suffer from a degraded signal-to-noise ratio (SNR).

Thus, in one embodiment, the present rate converter implements an IIR filter configured with a feedforward circuit and a feedback circuit to convert the input signal according to a least squares minimization. The feedforward circuit is configured to operate at the first sample rate (the frequency of the input signal) while the feedback circuit is configured to operate at the second sample rate (the frequency of the output signal). Accordingly, the IIR filter includes input-side components that operate at the first sample rate (input frequency) and output-side components that operate at the second sample rate (output frequency). This structure is in contrast to other rate converters that only operate at the input sample rate. Consequently, the present rate converter with the IIR filter reduces difficulties with SNR while converting the input signal between the two sample rates, which generates an improved output signal.

Figure 1:
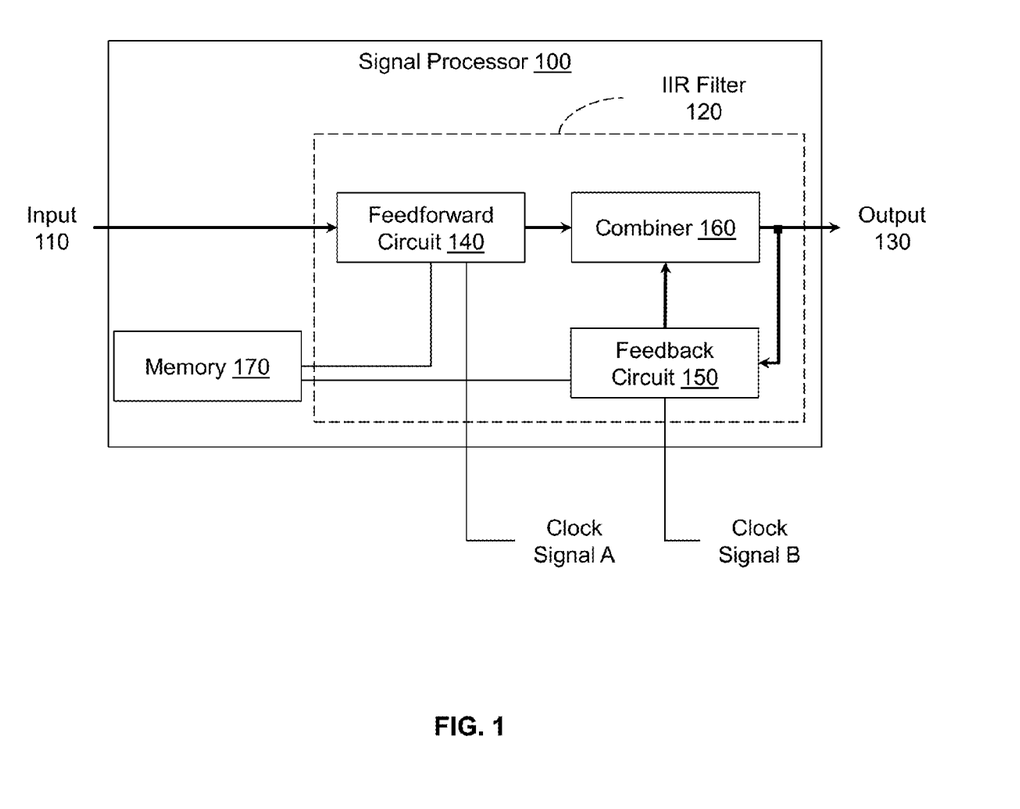
FIG. 1 illustrates one embodiment of a signal processor associated with converting a signal from a first sampling rate to a second sampling rate.

With reference to FIG. 1, one embodiment of a signal processor 100 associated with converting an input signal between sampling rates is illustrated. In one embodiment, the signal processor 100 is a multi-rate signal processor or digital signal processor (DSP) that is configured to convert the input signal from a first sampling rate to a second sampling rate. In general, the signal processor 100 receives discrete data samples in the form of the input signal on an input 110. The input signal is a digital signal comprised of discrete data samples from, for example, a continuous signal (e.g., analog signal) or another digital signal. In one embodiment, the digital signal is a digital audio signal, digital multimedia signal, a communication signal (e.g., $3^{rd}$ Generation Partnership Project (3GPP)) or, more generally, any digital signal that may be converted from a first sampling rate to a second sampling rate.

The discrete samples represent values of an original signal (e.g., an analog signal or digital signal) at discrete points in time according to a first sampling rate. That is, the discrete samples are values obtained at periodic intervals from the original signal as defined by the first sampling rate. This periodic sampling provides the input signal in a digital form that represents the original analog signal but is comprised of the discrete samples provided at the first sampling rate.

Thus, the discrete samples are electronically streamed to and received by the signal processor 100 via the input 110 at the first sampling rate. An infinite impulse response (IIR) filter 120 in the signal processor 100 processes the discrete samples of the input signal to produce an output signal with a different second sampling rate. The output signal is provided on an output 130. In one embodiment, the IIR filter 120 is configured to non-uniformly interpolate samples to generate the output signal according to samples of the input signal. That is, the IIR filter 120 interpolates the samples of the output signal in a manner that is not uniform but instead is according to different coefficients with different weight values.

Figure 2:
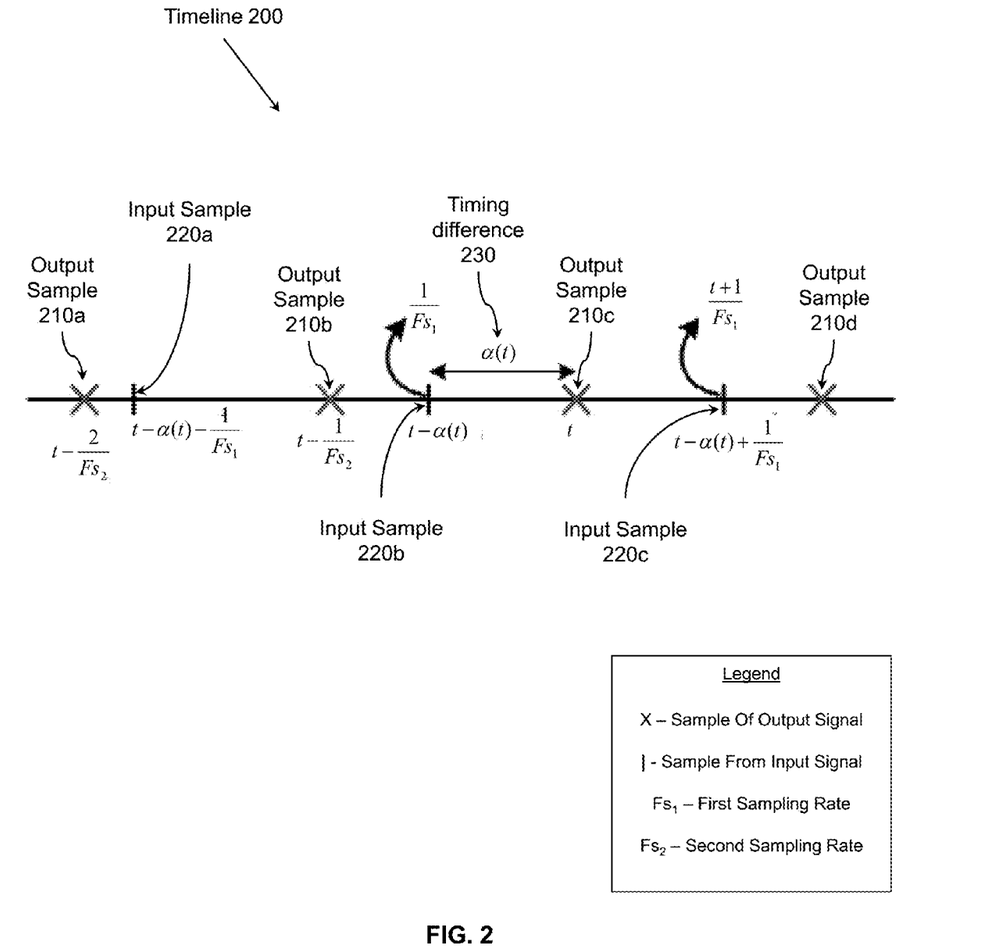
FIG. 2 illustrates a timeline of samples at two separate sampling rates.

To further understand a relationship of samples between the input signal and the output signal consider FIG. 2, which illustrates a timeline 200 for samples of the input signal and the output signal. The timeline 200 generally shows relationships between timing of various samples. Output samples 210a, 210b, 210c, and 210d, marked on the timeline 200 with an "X," represent interpolated samples of the output signal. Furthermore, samples 220a, 220b, and 220c, marked on the timeline 200 with a hash "I" represent discrete samples of the input signal. The timeline 200 is centered about the output sample 210c, which is from a current time "t." Thus, the output sample 210c would be a sample presently being interpolated by the IIR filter 120 of FIG. 1.

A timing difference 230 is represented by "α(t)" and is a difference in time between the output sample 210c and the input sample 220b, which is the immediately previous sample from the input signal. Thus, the input sample 220b is related to the output sample 210c according to t−α(t) in the time-domain. Remaining relationships are specified in FIG. 2 according to the first sampling rate ($Fs_1$) and the second sampling rate ($Fs_2$). Associating the samples in the time-domain specifies how the known samples of the input signal and previous interpolated samples of the output signal (210a, 210b) are related to a sample that is presently being interpolated (i.e., sample 210c). Additionally, a relationship between the output sample 210c from time t is given by $$\frac{l}{Fs_1} \leq t < \frac{l+1}{Fs_1},$$

where "l" is an integer that satisfies the inequality. This association is subsequently used as a basis for interpolating samples (e.g., sample 210c) in the output signal. Additional derivation of these values is shown in Appendix A.

Furthermore, the IIR filter 120 is configured to interpolate samples when converting the input signal to the second sampling rate because the samples from the input signal generally do not match with timing for samples of the output signal. Accordingly, the IIR filter 120 of FIG. 1 interpolates or otherwise estimates the samples of the output signal according to a recursive structure that uses a least squares approach to generate the samples of the output signal.

For example, the IIR filter 120 provides the output signal according to equation (1).

$$y(t) = \sum_{m=-M}^{M-1} b_m(\alpha(t)) x\left(t - \alpha(t) - \frac{m}{Fs_1}\right) - \sum_{k=1}^{K} a_k y\left(t - \frac{k}{Fs_2}\right) \quad (1)$$

In one embodiment, circuitry of the IIR filter 120 is configured to generate the output signal as a function of the input signal as modeled by Equation (1). In general, Equation (1) illustrates a least squares based approach for converting the input signal to a different sampling rate by interpolating samples of the output signal. In equation (1), y(t) represents the output signal, x represents the input signal for a specified sample in relation to the output signal, t is a current time of a sample of the output signal, $Fs_1$ is the first sampling rate, $Fs_2$ is the second sampling rate, α(t) is the distance between the presently interpolated sample of the output signal and the previous sample of the input signal as discussed in relation to FIG. 2.

Additionally, in equation (1), k indicates a previous sample of the output signal, $a_k$ is a feedback coefficient, M and "m" are integer values that indicate a previous input signal according to a feedforward channel length, and $b_m$ represents a feedforward component of the interpolating. Further derivation and explanation of $b_m$ and $a_k$ is shown in Appendix A. In general, $b_m$ and $a_k$ are approximated using polynomials to provide an approach that permits using circuitry that implements the polynomials with, for example, only basic arithmetic functions such as addition and multiplication. In this way, the IIR filter 120 can be implemented on a smaller chip area while operating more efficiently.

Returning to FIG. 1 and the signal processor 100, in one embodiment, the IIR filter 120 is comprised of multiple different circuits that operate at different frequencies. For example, the IIR filter 120 includes a feedforward circuit 140, a feedback circuit 150, and a signal combiner 160. The feedforward circuit 140 operates at a frequency of the first sampling rate (frequency of the input signal) while the feedback circuit 150 operates at a frequency of the second sampling rate (frequency of the converted signal). As used within this disclosure, to operate at a particular frequency means that a basic clocking of hardware components that comprise the circuit is set to the noted frequency/sampling rate. The sampling rate generally refers to a data rate of discrete data elements in a digital signal. That is, data elements or values in a digital signal occur at a particular frequency that is the sampling rate or also referred to as a data rate.

Furthermore, as illustrated in FIG. 1, the feedforward circuit 140 is clocked/operated according to a clock signal A while feedback circuit 150 is clocked/operated according to a clock signal B that is different from the clock signal A. The clock signals A and B are, for example, separate clocking/timing signals generated by the signal processor 100. In another implementation, the clock signals A and B are generated by an element/device external to the processor 100. In one embodiment, the clock signals A and B are generated according to a clock signal of the signal processor 100 by delaying or otherwise modifying the clock signal of the signal processor 100. In either case, the feedforward circuit 140 and the feedback circuit 150 are configured to operate at different frequencies that are a function of the first sampling rate (of the input signal) and the second sampling rate (of the output signal).

In one embodiment, the feedforward circuit 140 is configured to generate a first intermediate value, also called a feedforward value, for interpolating the output signal. The feedforward circuit 140 generates the first intermediate value as, for example, a function of a feedforward coefficient and the input signal.

The feedback circuit 150 is, in one embodiment, configured to generate a second intermediate value, also called a feedback value, as a function of a feedback coefficient and a predetermined number of previous samples of the output signal. Additional aspects of generating the feedforward value and the feedback value will be discussed subsequently. However, in general, the first intermediate value and the second intermediate value are intermediate transformations of the input signal and the predetermined number of previous samples of the output signal.

That is, for example, the IIR filter 120 is configured with circuitry according to a complex set of polynomials to alter the discrete samples of the input signal and previous samples of the output signal for generating a current value of the output signal. For example, the feedback circuit 150 uses feedback from the signal combiner 160 (i.e., previous samples of the output signal) along with the feedback coefficient $a_k$ to generate the feedback value that is provided to the signal combiner. In this way, the feedback circuit 150 recursively accounts for previous values of the output signal when generating a current sample of the output signal.

Similarly, the feedforward circuit 140 uses a feedforward coefficient along with current and previous samples of the input signal to generate the feedforward value. In one embodiment, the feedback coefficient and the feedforward coefficient are retrieved by the respective circuits from a memory 170 prior to initiation of converting the input signal. In another embodiment, the signal processor 100 dynamically calculates the coefficients. For example, the feedback coefficient $a_k$ is, for example, a specific value that depends on the first sampling rate $Fs_1$ and the second sampling rate $Fs_2$. That is, depending on values of $Fs_1$ and $Fs_2$ the value of $a_k$ will vary as will the value of the feedforward coefficients. Thus, the values may be stored in the memory 170 or dynamically generated by the signal processor 100 for use once the first sampling rate and the second sampling rate are known.

In either case, the IIR filter 120 uses the coefficients to, for example, weight the previous output samples and the previous input samples when interpolating the samples of the output signal. In this way, the IIR filter non-uniformly uses the previous samples to generate a current sample of the output signal.

Figure 3:
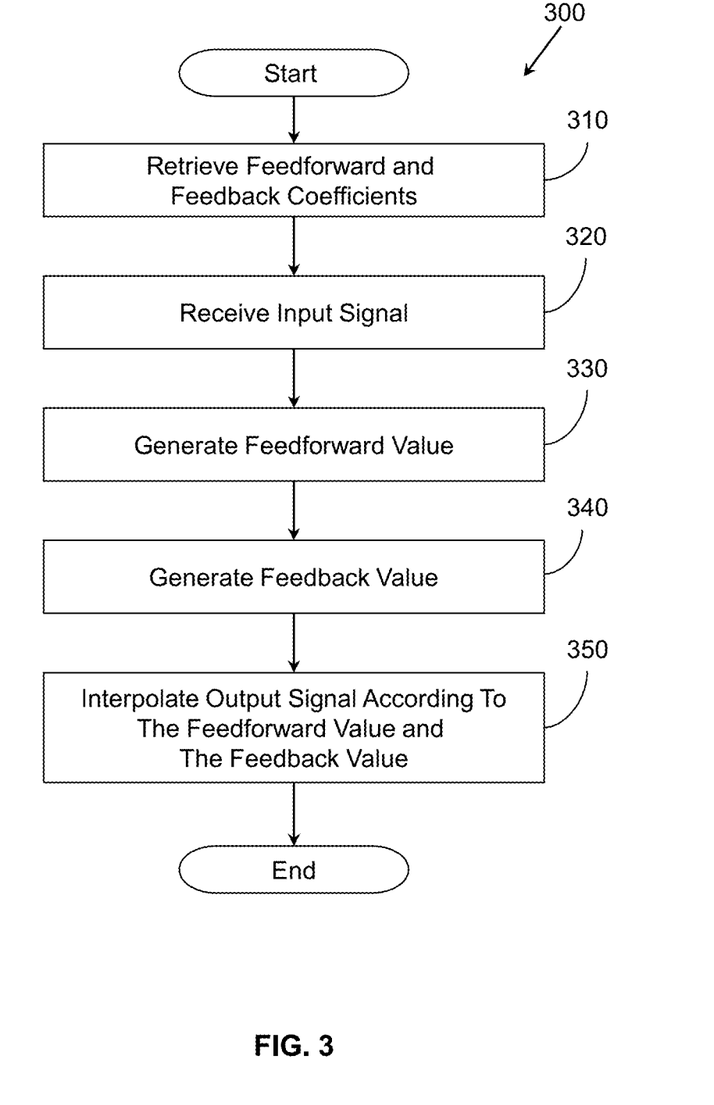
FIG. 3 illustrates one embodiment of a method associated with converting a sampling rate of a digital signal.

Further aspects of converting the input signal to a different sampling rate will be discussed in relation to FIG. 3. FIG. 3 illustrates a method 300 associated with converting a digital signal to a different sampling rate. FIG. 3 will be discussed from the perspective of the signal processor 100 of FIG. 1. However, the method 300 is not limited to being implemented by the signal processor 100. In other embodiments, the method 300 may be implemented in an application specific integrated circuit (ASIC), as instructions stored on a non-transitory computer readable medium, and so on.

At 310, feedforward coefficients and feedback coefficients are retrieved. In one embodiment, the coefficients are retrieved from a memory in preparation for converting an input signal to a different sampling rate. In general, the coefficients are dependent on the first sampling rate and the second sampling rate. Thus, once the sampling rates are, for example, determined, then the coefficients for converting between the two rates can be retrieved from the memory according to the sampling rates and loaded into the respective circuits.

That is, the memory may include coefficients for converting between many different samplings rates. Thus, a particular set of coefficients that is relevant to the current sampling rates is determined and retrieved from memory. Furthermore, while retrieving the coefficients from memory is discussed the coefficients may also be calculated on-the-fly depending on the particular implementation. In either case, equation (36) of Appendix A indicates one way in which the coefficients may be determined. Accordingly, the signal processor 100 or another device performing method 300 may be configured to convert between different sampling rates depending on a given input signal.

At 320, the input signal is received. Of course, the input signal is not completely received in a single instance. Instead, the input signal is generally received at a given frequency that corresponds to the first sampling rate. Thus, while illustrated as a consecutive block, the input signal is actually continuously received so long as the signal is being converted. Furthermore, as previously mentioned, the input signal is a digital signal that is comprised of discrete samples provided at the first sampling rate.

At 330, a feedforward value of the output signal is generated. Equation (1) from appendix A illustrates the output signal according to previous input and output samples. Furthermore, a first portion of Equation (1) is a feedforward value associated with a feedforward channel (i.e., the feedforward circuit 140) as provided by:

$$\sum_{m=-M}^{M-1} b_m(\alpha(t))x\left(t - \alpha(t) - \frac{m}{Fs_1}\right).$$

Appendix A illustrates a derivation of equations (7) and (10) which are an optimized form of the first portion of Equation (1). As noted previously, the feedforward coefficient $C_p$ is given by Equation (36). Thus, generating the feedforward values includes, in one embodiment, electronically transforming the input signal according to Equations (7), (10) and (36).

Subsequently, at 340, a feedback value of the output signal is generated. A second portion of Equation (1) is a feedback component associated with a feedback channel (e.g., feedback circuit 150) as provided by:

$$\sum_{k=1}^{K} a_k y\left(t - \frac{k}{Fs_2}\right),$$

where $a_k$ is given by equation (36) as derived in the Appendix A. Variable $a_k$ is the feedback coefficient and is, for example, a fixed coefficient for converting between two sampling rates. Thus, using the feedback coefficient and previous samples of the output signal the feedback value can be generated. In one embodiment, generating the feedback value includes electronically transforming the previous samples of the output signal according to the second portion of equation (1) using a feedback coefficient $a_k$ as defined by equation (36). In the previous equation, k is an integer value that represents previous samples of the output signal from k=1 to K. Upper case K is defined according to a predetermined number of output samples that are to be used in the interpolation of a current sample. Accordingly, K may be an integer value from 1 to, for example, 3 or more depending on a particular implementation.

At 350, the feedfoward value and the feedback value are combined to generate a sample of the output signal. As illustrated in equation (1), the two values are, for example, subtracted to produce the sample of the output signal. That is, the feedback value is subtracted from the feedforward value to generate the sample as a current output at the second sampling rate. In this way, the output signal is generated at the second sampling rate.

Furthermore, as can be seen from equation (1), the feedforward value is generated using samples of the input signal, whereas the feedback value is generated using samples of the output signal. Accordingly, the two values are generated at different frequencies and associated portions of the IIR filter 120 operate at the different frequencies of $Fs_1$ and $Fs_2$. In this way, the IIR filter 120 is configured with technical improvements in the field that improve SNR, improve a semiconductor chip area used to implement the IIR filter 120, and also improve operating efficiency of the signal processor 100 (e.g., improved number of calculations).

Figure 4:
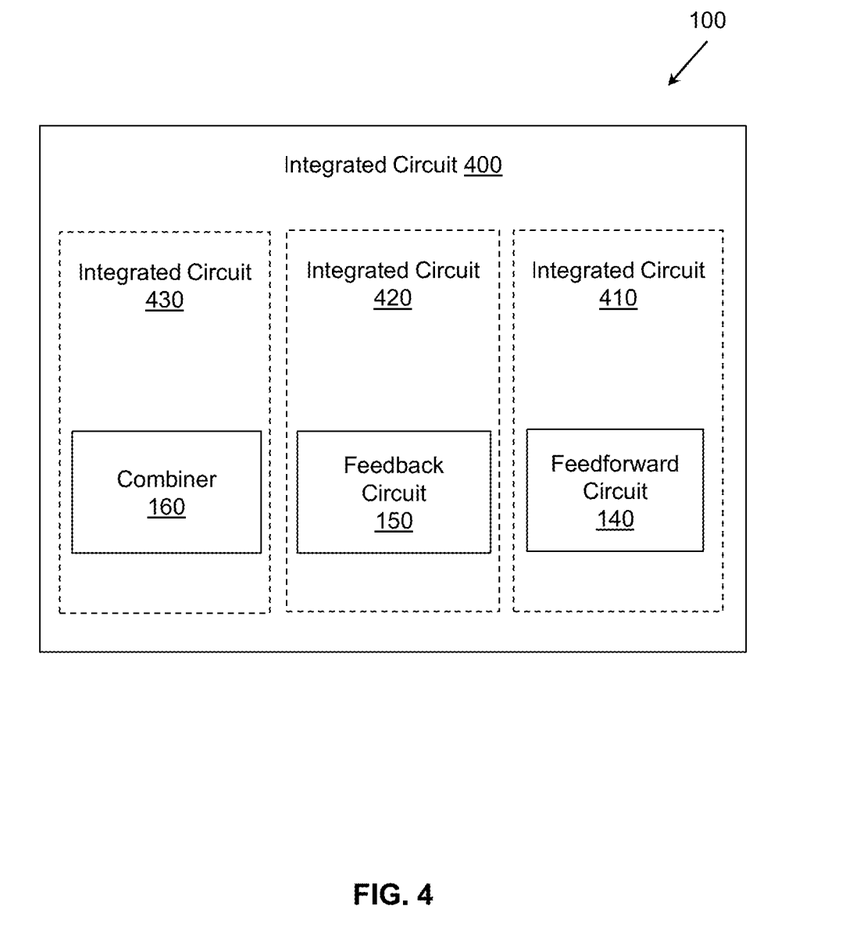
FIG. 4 illustrates one embodiment of an integrated circuit associated with sample rate conversion of a digital signal.

FIG. 4 illustrates another embodiment of the signal processor 100 from FIG. 1 that is configured with separate integrated circuits and/or chips. In this embodiment, the feedforward circuit 140 from FIG. 1 is embodied as a separate integrated circuit 410. Additionally, the feedback circuit 150 is embodied on an individual integrated circuit 420. The combiner 160 of FIG. 1 is also embodied on a separate circuit 430. The circuits are coupled via connection paths to communicate signals. While integrated circuits 410, 420 and 430 are illustrated as separate integrated circuits, they may be integrated into an integrated circuit 400. Additionally, integrated circuits 410, 420 and 430 may be combined into fewer integrated circuits or divided into more integrated circuits than illustrated. Additionally, in another embodiment, the integrated circuits 410, 420 and 430 may be combined into a separate application specific integrated circuit. Furthermore, in one embodiment, the feedforward circuit 140 and/or the feedback circuit 150 may be software modules stored in a non-transitory computer-readable medium that is embedded within a hardware processor or similar device.

Accordingly, the signal processor 100 improves the technical field sample rate conversion while also improving the technical field of wireless communications as realized by improved efficiencies from the present disclosure.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer storage medium" as used herein is a non-transitory medium that stores instructions and/or data. A computer storage medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer storage media may include, but are not limited to, a floppy disk, a flexible disk, a hard disk, a magnetic tape, other magnetic medium, an ASIC, a CD, other optical medium, a RAM, a ROM, a memory chip or card, a memory stick, and other electronic media that can store computer instructions and/or data. Computer storage media described herein are limited to statutory subject matter under 35 U.S.C §101.

"Logic" as used herein includes a computer or electrical hardware component(s), firmware, a non-transitory computer storage medium that stores instructions, and/or combinations of these components configured to perform a function(s) or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions that when executed perform an algorithm, and so on. Logic may include one or more gates, combinations of gates, or other circuit components. Where multiple logics are described, it may be possible to incorporate the multiple logics into one physical logic component. Similarly, where a single logic unit is described, it may be possible to distribute that single logic unit between multiple physical logic components. Logic as described herein is limited to statutory subject matter under 35 U.S.C §101.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional actions that are not illustrated in blocks.

The methods described herein are limited to statutory subject matter under 35 U.S.C §101.

To the extent that the term "includes" or "including" is employed in the detailed description or the claims, it is intended to be inclusive in a manner similar to the term "comprising" as that term is interpreted when employed as a transitional word in a claim.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

APPENDIX A

The following generally illustrates a derivation of equations provided herein that are used with aspects of converting a first signal with a sample rate of $Fs_1$ to a second signal with a second sampling rate of $Fs_2$ using least square optimization. The value of the signal y(t) at a time t given the values of the input signal at times $$t - \alpha(t) - \frac{m}{Fs_1}, m = -M, -M+1, \ldots, M-1,$$

and previously estimated samples $$y\left(t - \frac{k}{Fs_2}\right) \text{ for } k = 1, 2, \ldots, K$$

of the output signal as shown FIG. 2.

In Equation (1) y(t) represents a modeled output for converting between sampling rates $Fs_1$ and $Fs_2$.

$$y(t) = \sum_{m=-M}^{M-1} b_m(\alpha(t))x\left(t - \alpha(t) - \frac{m}{Fs_1}\right) - \sum_{k=1}^{K} a_k y\left(t - \frac{k}{Fs_2}\right) \quad (1)$$

where $$\alpha(t) = t - \frac{l}{Fs_1} \text{ for } \frac{l}{Fs_1} \le t < \frac{l+1}{Fs_1}.$$

l is an integer value that satisfies the inequality for t.

By taking Fourier transform of equation (1) the following is derived, $$Y(\omega) = \quad (2)$$

$$\sum_{m=-M}^{M-1} \int_{-\infty}^{\infty} b_m(\alpha(t))x\left(t - \alpha(t) - \frac{m}{Fs_1}\right)e^{-j\omega t}dt - \sum_{k=1}^{K} a_k Y(w)e^{-j\omega\frac{k}{Fs_2}}$$

-continued $$= \sum_{m=-M}^{M-1} \sum_{l=-\infty}^{\infty} \int_{\frac{l}{Fs_1}}^{\frac{l+1}{Fs_1}} \underbrace{b_m\left(t - \frac{l}{Fs_1}\right)}_{\tau} x\left(t - t + \frac{l}{Fs_1} - \frac{m}{Fs_1}\right)e^{-j\omega t}dt - \quad (3)$$

$$Y(w)\sum_{k=1}^{K} a_k e^{-j\omega\frac{k}{Fs_2}}$$

$$= \sum_{m=-M}^{M-1} \sum_{l=-\infty}^{\infty} x\left(\frac{l-m}{Fs_1}\right) \int_0^{\frac{1}{Fs_1}} b_m(\tau)e^{-j\omega\left(\tau + \frac{l}{Fs_1}\right)}d\tau - Y(w)\sum_{k=1}^{K} a_k e^{-j\omega\frac{k}{Fs_2}} \quad (4)$$

$$= \sum_{m=-M}^{M-1} \sum_{r=-\infty}^{\infty} x\left(\frac{r}{Fs_1}\right) \int_0^{\frac{1}{Fs_1}} b_m(\tau)e^{-j\omega\left(\tau + \frac{r+m}{Fs_1}\right)}d\tau - Y(w)\sum_{k=1}^{K} a_k e^{-j\omega\frac{k}{Fs_2}} = \quad (5)$$

$$\sum_{r=-\infty}^{\infty} x\left(\frac{r}{Fs_1}\right)e^{-j\omega\frac{r}{Fs_1}} \sum_{m=-M}^{M-1} \int_0^{\frac{1}{Fs_1}} b_m(t)e^{-j\omega\left(\tau + \frac{m}{Fs_1}\right)}d\tau -$$

$$Y(w)\sum_{k=1}^{K} a_k e^{-j\omega\frac{k}{Fs_2}}$$

$$= \left[\sum_{r=-\infty}^{\infty} x\left(\frac{r}{Fs_1}\right)e^{-j\omega\frac{r}{Fs_1}}\right] \sum_{m=-M}^{M-1} \int_{\frac{m}{Fs_1}}^{\frac{m+1}{Fs_1}} b_m\left(\beta - \frac{m}{Fs_1}\right)e^{-j\omega\beta}d\beta - \quad (6)$$

$$Y(w)\sum_{k=1}^{K} a_k e^{-j\omega\frac{k}{Fs_2}} = \left[Fs_1\sum_{n=-\infty}^{\infty} X(\omega - n2\pi Fs_1)\right]$$

$$\sum_{m=-M}^{M-1} \int_{\frac{m}{Fs_1}}^{\frac{m+1}{Fs_1}} b_m\left(\beta - \frac{m}{Fs_1}\right)e^{-j\omega\beta}d\beta - Y(w)\sum_{k=1}^{K} a_k e^{-j\omega\frac{k}{Fs_2}}$$

Let $b(t) = \begin{cases} b_{-M}\left(t - \frac{-M}{Fs_1}\right) & \text{for } \frac{-M}{Fs_1} \le t < \frac{-M+1}{Fs_1} \\ b_{-M+1}\left(t - \frac{-M+1}{Fs_1}\right) & \text{for } \frac{-M+1}{Fs_1} \le t < \frac{-M+2}{Fs_1} \\ \vdots & \\ b_{M-1}\left(t - \frac{M-1}{Fs_1}\right) & \text{for } \frac{M-1}{Fs_1} \le t < \frac{M}{Fs_1} \\ 0 & \text{otherwise} \end{cases} \quad (7)$ and let $B(\omega) = \int_{-\infty}^{\infty} b(t)e^{-j\omega t}dt$, then $$Y(\omega) = \left[Fs_1 \sum_{n=-\infty}^{\infty} X(\omega - n2\pi Fs_1)\right]B(\omega) - Y(w)\sum_{k=1}^{K} a_k e^{-j\omega\frac{k}{Fs_2}} \quad (8)$$

$$= \frac{B(\omega)}{1 + \sum_{k=1}^{K} a_k e^{-j\omega\frac{k}{Fs_2}}}\left[Fs_1 \sum_{n=-\infty}^{\infty} X(\omega - n2\pi Fs_1)\right] \quad (9)$$

So, $$\frac{B(\omega)}{1 + \sum_{k=1}^{K} a_k e^{-j\omega\frac{k}{Fs_2}}}$$

is similar to $$\begin{cases} \dfrac{1}{Fs_1} & \text{for } |\omega| < \pi Fs_1 \\ 0 & \text{for } |\omega| > \pi Fs_1 \end{cases}$$

Here we b(t) can be represented by a polynomial of degree P, i.e., $$b(t) = \begin{cases} \sum_{p=0}^{P} c_p t^p & \text{for } \dfrac{-M}{Fs_1} \le t < \dfrac{M}{Fs_1} \\ 0 & \text{otherwise} \end{cases} \quad (10)$$

Accordingly, if $G(\omega) = \int_{-\infty}^{\infty} g(t)e^{-j\omega t}dt$, then $j^p \dfrac{d^p}{d\omega^p}G(\omega) = \int_{-\infty}^{\infty} t^p g(t)e^{-j\omega t}dt$ and if $g(t) = 1$ for $-\dfrac{M}{Fs_1} \le t < \dfrac{M}{Fs_1}$ then $$G(\omega) = \int_{-\frac{M}{Fs_1}}^{\frac{M}{Fs_1}} e^{-j\omega t}dt = \dfrac{1}{-j\omega}\left[e^{-j\omega\frac{M}{Fs_1}} - e^{j\omega\frac{M}{Fs_1}}\right] = 2\operatorname{sinc}\left(\dfrac{M}{Fs_1}\omega\right)\dfrac{M}{Fs_1} \quad (11)$$

Therefore, $$B(\omega) = \sum_{p=0}^{P} c_p j^p \dfrac{d^p}{d\omega^p}\left[2\operatorname{sinc}\left(\dfrac{M}{Fs_1}\omega\right)\right]\dfrac{M}{Fs_1} \quad (12)$$

defining $\operatorname{dersinc}(\omega; p) = \dfrac{d^p}{d\omega^p}\operatorname{sinc}(\omega)$, then $$B(\omega) = 2\sum_{p=0}^{P} c_p j^p \left(\dfrac{M}{Fs_1}\right)^{p+1} \operatorname{dersinc}\left(\dfrac{M}{Fs_1}\omega; p\right) \quad (13)$$

coefficients $c_p$'s and $a_k$'s are determined using the following optimization.

$$\tilde{c}'_p s, \tilde{a}'_k s = \operatorname{argmin}_{c_p', a_k'}\left\{\int_{-\infty}^{\infty}\left|B(\omega) - \left(1 + \sum_{k=1}^{K} a_k e^{-j\omega\frac{k}{Fs_1}}\right) \times \begin{cases} \dfrac{1}{Fs_1} & \text{for } |\omega| < \pi Fs_1 \\ 0 & \text{for } |\omega| > \pi Fs_1 \end{cases}\right|^2 d\omega\right\} \quad (14)$$

$$= \operatorname{argmin}_{c_p', a_k'}\left\{\int_{-\infty}^{\infty}|B(\omega)|^2 d\omega \right. \quad (I) \ (15)$$

$$-\dfrac{1}{Fs_1}\left[\int_{-\pi Fs_1}^{\pi Fs_1} B(\omega)\left(1 + \sum_{k=1}^{K} a_k e^{-j\omega\frac{k}{Fs_2}}\right)^* + \int_{-\pi Fs_1}^{\pi Fs_1} B^*(\omega)\left(1 + \sum_{k=1}^{K} a_k e^{-j\omega\frac{k}{Fs_2}}\right)\right] \quad (II)$$

$$\left. +\dfrac{1}{Fs_1^2}\int_{-\pi Fs_1}^{\pi Fs_1}\left|1 + \sum_{k=1}^{K} a_k e^{-j\omega\frac{k}{Fs_2}}\right|^2 d\omega\right\} \quad (III)$$

$$(I) = \int_{-\infty}^{\infty}|B(\omega)|^2 d\omega = \int_{-\infty}^{\infty} 4\sum_{p_1=0}^{P}\sum_{p_2=0}^{P} c_{p_1} c_{p_2} j^{(p_1-p_2)}\left(\dfrac{M}{Fs_1}\right)^{(p_1+p_2+2)} \quad (16)$$

$$\operatorname{dersinc}\left(\dfrac{\lambda}{\frac{M}{Fs_1}}\omega, p_1\right)\operatorname{dersinc}\left(\dfrac{M}{Fs_1}\omega; p_2\right)d\omega$$

$$= \sum_{p_1=0}^{P}\sum_{p_2=0}^{P} c_{p_1} c_{p_2} 4 j^{(p_1-p_2)}\left(\dfrac{M}{Fs_1}\right)^{(p_1+p_2+2)} \quad (17)$$

$$\int_{-\infty}^{\infty} \operatorname{dersinc}(\lambda; p_1)\operatorname{dersinc}(\lambda; p_2)\dfrac{Fs_1}{M}d\lambda$$

$$= \sum_{p_1=0}^{P}\sum_{p_2=0}^{P} c_{p_1} C[p_1, p_2] c_{p_2} \quad (18)$$

where C is a P×P matrix whose element at $p_1$-th row and $p_2$-th column is given by $$C[p_1, p_2] = \quad (19)$$
$$4j^{(p_1-p_2)}\left(\dfrac{M}{Fs_1}\right)^{(p_1+p_2+1)}\int_{-\infty}^{\infty}\operatorname{dersinc}(\lambda; p_1)\operatorname{dersinc}(\lambda; p_2)d\lambda$$

Let $a_0 = 1$, then $(II) = \quad (20)$ $$-\dfrac{1}{Fs_1}\left\{\int_{-\pi Fs_1}^{\pi Fs_1}\left[B(\omega)\sum_{k=0}^{K} a_k e^{j\omega\frac{k}{Fs_2}} + B^*(\omega)\sum_{k=0}^{K} a_k e^{-j\omega\frac{k}{Fs_2}}\right]d\omega\right\}$$

$$= -\dfrac{1}{Fs_1}\left\{\int_{-\pi Fs_1}^{\pi Fs_1}\sum_{k=0}^{K} a_k \sum_{p=0}^{P} c_p\left[2j^p\left(\dfrac{M}{Fs_1}\right)^{(p+1)}\right.\right. \quad (21)$$

$$\operatorname{dersinc}\left(\dfrac{M}{Fs_1}\omega; p\right)\left(\cos\left(\omega\dfrac{k}{Fs_2}\right) + j\sin\left(\omega\dfrac{k}{Fs_2}\right)\right)$$

$$+2(-j)^p\left(\dfrac{M}{Fs_1}\right)^{(p+1)}\operatorname{dersinc}\left(\dfrac{M}{Fs_1}\omega; p\right)\left(\cos\left(\omega\dfrac{k}{Fs_2}\right) - j\sin\left(\omega\dfrac{k}{Fs_2}\right)\right)\Big]d\omega\Big\} \quad (22)$$

$$= \sum_{k=0}^{K}\sum_{p=0}^{P} a_k c_p\left\{-\dfrac{2}{Fs_1}\left(\dfrac{M}{Fs_1}\right)^{(p+1)}\right. \quad (23)$$

$$\int_{-\pi Fs_1}^{\pi Fs_1}\operatorname{dersinc}\left(\dfrac{\lambda}{\frac{M}{Fs_1}}\omega; p\right)\left(\cos\left(\omega\dfrac{k}{Fs_2}\right)[1+(-1)^p]j^p + \sin\left(\omega\dfrac{k}{Fs_2}\right)[1+(-1)^{p+1}]j^{p+1}\right)d\omega\right\}$$

$$= \sum_{k=0}^{K}\sum_{p=0}^{P} a_k c_p \quad (24)$$

$$\left\{-\dfrac{2}{Fs_1}\left(\dfrac{M}{Fs_1}\right)^p\int_{-M\pi}^{M\pi}\operatorname{dersinc}(\lambda; p)\left(\cos\left(\lambda\dfrac{k}{M}\dfrac{Fs_1}{Fs_2}\right)[1+(-1)^p]\right.\right.$$

$$j^p + \sin\left(\lambda\dfrac{k}{M}\dfrac{Fs_1}{Fs_2}\right)[1+(-1)^{p+1}]j^{p+1}\Big)d\lambda\Big\}$$

$$= \sum_{k=0}^{K}\sum_{p=0}^{P} a_k c_p B[k, p] \quad (25)$$

where B is a K×P matrix whose elements are given by:

$$-\frac{2}{Fs_1}\left(\frac{M}{Fs_1}\right)^p \int_{-M\pi}^{M\pi} dersinc(\lambda; p) \quad (26)$$

$$\left(\cos\left(\lambda\frac{k}{M}\frac{Fs_1}{Fs_2}\right)[1+(-1)^p]j^p + \sin\left(\lambda\frac{k}{M}\frac{Fs_1}{Fs_2}\right)[1+(-1)^{p+1}]j^{p+1}\right)d\lambda$$

$$(III) = \frac{1}{Fs_1^2}\int_{-\pi Fs_1}^{\pi Fs_1}\sum_{k_1=0}^{K}\sum_{k_2=0}^{K}a_{k_1}a_{k_2}e^{-j\omega\frac{k_1-k_2}{Fs_2}}d\omega \quad (27)$$

$$= \frac{1}{Fs_1^2}\sum_{k_1 \neq k_2}a_{k_1}a_{k_2}\int_{-\pi Fs_1}^{\pi Fs_1}e^{-j\omega\frac{k_1-k_2}{Fs_2}}d\omega + \frac{1}{Fs_1^2}\sum_{k=0}^{K}a_k^2 2\pi Fs_1 \quad (28)$$

$$= \sum_{k_1 \neq k_2}a_{k_1}a_{k_2}\frac{1}{Fs_1^2}\frac{Fs_2}{-j(k_1-k_2)}\left(e^{-j\pi Fs_1\frac{k_1-k_2}{Fs_2}} - e^{j\pi Fs_1\frac{k_1-k_2}{Fs_2}}\right) + \quad (29)$$

$$\frac{1}{Fs_1^2}\sum_{k=0}^{K}a_k^2 2\pi Fs_1$$

$$= \sum_{k_1 \neq k_2}a_{k_1}a_{k_2}\frac{2}{Fs_1^2}\frac{Fs_2}{(k_1-k_2)}\sin\left(\pi Fs_1\frac{k_1-k_2}{Fs_2}\right) + \frac{2\pi}{Fs_1}\sum_{k=0}^{K}a_k^2 \quad (30)$$

$$= \sum_{k_1=0}^{K}\sum_{k_2=0}^{K}a_{k_1}a_{k_2}A[k_1,k_2] \quad (31)$$

where A is a K×K matrix whose elements are given by $$A[k_1, k_2] = \begin{cases} \frac{2}{Fs_1^2}\frac{Fs_2}{(k_1-k_2)}\sin\left(\pi Fs_1\frac{k_1-k_2}{Fs_2}\right) & \text{for } k_1 \neq k_2 \\ \frac{2\pi}{Fs_1} & \text{for } k_1 = k_2 \end{cases} \quad (32)$$

So the optimization becomes:

$$\tilde{c}_p's, \tilde{a}_k's = \text{argmin}_{c_p's, a_k's}[a_0 a_1 a_2 \ldots a_k c_1 c_2 \ldots c_p] \quad (33)$$

$$\overbrace{\begin{bmatrix} A & .5B \\ .5B^T & C \end{bmatrix}}^{G}[a_0 a_1 a_2 \ldots a_k c_1 c_2 \ldots c_p]^T$$

G is (K+P)×(K+P) symmetric matrix which looks like:

$$G = \begin{bmatrix} g_{1,1} & g_{1,2} & \cdots & g_{1,(K+P)} \\ g_{2,1} & g_{2,2} & \cdots & g_{2,(K+P)} \\ \vdots & \vdots & \ddots & \vdots \\ g_{(K+P),1} & g_{(K+P),2} & \cdots & g_{(K+P),(K+P)} \end{bmatrix} = \quad (34)$$

$$\begin{bmatrix} g_{1,1} & g_{1,2} & \cdots & g_{1,(K+P)} \\ g_{2,1} & & & \\ \vdots & & G' & \\ g_{(K+P),1} & & & \end{bmatrix}$$

Let $g=[g_{1,2} \ldots g_{1,(K+P)}]^T$ and since $a_0$ is known to be 1, then rewriting the optimization as $$\tilde{c}_p's, \tilde{a}_k's = \text{argmin}_{c_p's, a_k's}[a_1 a_2 \ldots a_K c_1 c_2 \ldots c_P]G'$$
$$[a_1 a_2 \ldots a_K c_1 c_2 \ldots c_P]^T + 2[a_1 a_2 \ldots a_K c_1 c_2 \ldots c_P]g \quad (35)$$

Taking derivative with respect to $[a_1 a_2 \ldots a_K c_1 c_2 \ldots c_p]$ and set it to zero provides $$[a_1 a_2 \ldots a_K c_1 c_2 \ldots c_P]^T = -(G')^{-1}g \quad (36)$$

What is claimed is:

1. An apparatus for converting an input signal with a first sampling rate into an output signal with a second sampling rate, the apparatus comprising:
   a feedforward circuit configured to receive the input signal that is comprised of discrete data samples with the first sampling rate, and to generate a first intermediate value that is based, at least in part, on (i) a feedforward coefficient and (ii) the input signal;
   a feedback circuit configured to generate a second intermediate value that is based, at least in part, on (i) a feedback coefficient and (ii) a predetermined number of previous samples of the output signal; and
   a signal combiner configured to combine the first intermediate value and the second intermediate value together to interpolate a data sample of the output signal at the second sampling rate, wherein the output signal is a converted form of the input signal at the second sampling rate,
   wherein the feedforward circuit, the feedback circuit and the signal combiner are part of an infinite impulse response (IIR) filter that is configured to generate the output signal at the second sampling rate using a least squares estimate to non-uniformly interpolate samples for the output signal, and wherein the first intermediate value and the second intermediate value are intermediate transformations of the input signal and the predetermined number of previous samples of the output signal.

2. The apparatus of claim 1, wherein the feedback circuit operates at the second sampling rate, and the feedforward circuit operates at the first sampling rate, and wherein the first sampling rate is different from the second sampling rate.

3. The apparatus of claim 1, wherein the feedforward circuit generates the first intermediate value according to b(t) as represented by:

$$b(t) = \begin{cases} b_{-M}\left(t - \frac{-M}{Fs_1}\right) & \text{for } \frac{-M}{Fs_1} \leq t < \frac{-M+1}{Fs_1} \\ b_{-M+1}\left(t - \frac{-M+1}{Fs_1}\right) & \text{for } \frac{-M+1}{Fs_1} \leq t < \frac{-M+2}{Fs_1} \\ \vdots \\ b_{M-1}\left(t - \frac{M-1}{Fs_1}\right) & \text{for } \frac{M-1}{Fs_1} \leq t < \frac{M}{Fs_1} \\ 0 & \text{otherwise} \end{cases}$$

$$b(t) = \begin{cases} \sum_{p=0}^{P}c_p t^p & \text{for } \frac{-M}{Fs_1} \leq t < \frac{M}{Fs_1} \\ 0 & \text{otherwise} \end{cases}$$

where $t^p$ is a polynomial of degree P,
where $c_p$ is the feedforward coefficient,
where $Fs_1$ is the first sampling rate,
where t represents a time of a current sample of the output signal that is being interpolated, and
where M is an integer that represents a length of a feedforward channel.

4. The apparatus of claim 1, wherein the feedback circuit generates the second intermediate value according to:

$$\sum_{k=1}^{K} a_k y\left(t - \frac{k}{Fs_2}\right)$$

where $a_k$ is the feedback coefficient,
where $Fs_2$ is the second sampling rate,
where t represents a time of a current sample of the output signal that is being interpolated,
where y( ) represents the output signal, and
where k is an integer that represents a previous sample of the output signal.

5. The apparatus of claim 1, wherein the feedforward coefficient and the feedback coefficient are determined according to:

$$[a_1 a_2 \ldots a_K c_1 c_2 \ldots c_P]^T = -(G')^{-1} g,$$

where $g = [g_{1,2} \ldots g_{1,(K+P)}]^T$,
where $\alpha_k$ represents the feedforward coefficient,
where $c_p$ represents the feedback coefficient, and
where G is a (K+P)×(K+P) symmetric matrix represented by $$G = \begin{bmatrix} g_{1,1} & g_{1,2} & \cdots & g_{1,(K+P)} \\ g_{2,1} & g_{2,2} & \cdots & g_{2,(K+P)} \\ \vdots & \vdots & \ddots & \vdots \\ g_{(K+P),1} & g_{(K+P),2} & \cdots & g_{(K+P),(K+P)} \end{bmatrix} = \begin{bmatrix} g_{1,1} & g_{1,2} & \cdots & g_{1,(K+P)} \\ g_{2,1} & & & \\ \vdots & & G' & \\ g_{(K+P),1} & & & \end{bmatrix}.$$

6. The apparatus of claim 1, wherein the feedforward circuit is configured to retrieve the feedforward coefficient from a memory according to values of the first sampling rate and the second sampling rate, and wherein the memory includes a lookup table of different feedforward coefficients for converting between different samplings rates.

7. A method for converting an input signal with a first sampling rate into an output signal with a second sampling rate, the method comprising:
    receiving, by an infinite impulse response (IIR) filter, the input signal that is comprised of discrete data samples obtained with the first sampling rate;
    generating, by the IIR filter, a first intermediate value for estimating the output signal, wherein the first intermediate value is based, at least in part, on a feedforward coefficient and the input signal;
    generating, by the IIR filter, a second intermediate value that is based, at least in part, on a feedback coefficient and a predetermined number of previous samples of the output signal; and
    interpolating, by the IIR filter, the output signal by combining the first intermediate value and the second intermediate value at the second sampling rate, wherein the output signal is a converted form of the input signal at the second sampling rate,
    wherein interpolating the output signal from the first intermediate value and the second intermediate value includes applying a least squares estimate to non-uniformly interpolate samples for the output signal, and wherein the first intermediate value and the second intermediate value are intermediate transformations of the input signal and the predetermined number of previous samples of the output signal.

8. The method of claim 7, wherein generating the second intermediate value occurs at the second sampling rate, and generating the first intermediate value occurs at the first sampling rate, and wherein the first sampling rate is different from the second sampling rate.

9. The method of claim 7, wherein generating the first intermediate value occurs according to b(t) as represented by:

$$b(t) = \begin{cases} b_{-M}\left(t - \frac{-M}{Fs_1}\right) & \text{for } \frac{-M}{Fs_1} \leq t < \frac{-M+1}{Fs_1} \\ b_{-M+1}\left(t - \frac{-M+1}{Fs_1}\right) & \text{for } \frac{-M+1}{Fs_1} \leq t < \frac{-M+2}{Fs_1} \\ \vdots & \\ b_{M-1}\left(t - \frac{M-1}{Fs_1}\right) & \text{for } \frac{M-1}{Fs_1} \leq t < \frac{M}{Fs_1} \\ 0 & \text{otherwise} \end{cases}$$

$$b(t) = \begin{cases} \sum_{p=0}^{P} c_p t^p & \text{for } \frac{-M}{Fs_1} \leq t < \frac{M}{Fs_1} \\ 0 & \text{otherwise} \end{cases}$$

where $t^p$ is a polynomial of degree P,
where $c_p$ is the feedforward coefficient,
where $Fs_1$ is the first sampling rate,
where t represents a time of a current sample of the output signal that is being interpolated, and
where M is an integer that represents a length of a feedforward channel.

10. The method of claim 7, wherein generating the second intermediate value includes calculating the second intermediate value according to:

$$\sum_{k=1}^{K} a_k y\left(t - \frac{k}{Fs_2}\right)$$

where $a_k$ is the feedback coefficient,
where $Fs_2$ is the second sampling rate,
where t represents a time of a current sample of the output signal that is being interpolated,
where y( ) represents the output signal, and
where k is an integer that represents a previous sample of the output signal.

11. The method of claim 7, further comprising generating the feedforward coefficient and the feedback coefficient according to:

$$[a_1 a_2 \ldots a_K c_1 c_2 \ldots c_P]^T = -(G')^{-1} g,$$

where $g = [g_{1,2} \ldots g_{1,(K+P)}]^T$,
where $\alpha_k$ represents the feedforward coefficeint,
where $c_p$ represents the feedback coefficient, and
where G is a (K+P)×(K+P) symmetric matrix represented by $$G = \begin{bmatrix} g_{1,1} & g_{1,2} & \cdots & g_{1,(K+P)} \\ g_{2,1} & g_{2,2} & \cdots & g_{2,(K+P)} \\ \vdots & \vdots & \ddots & \vdots \\ g_{(K+P),1} & g_{(K+P),2} & \cdots & g_{(K+P),(K+P)} \end{bmatrix} = \begin{bmatrix} g_{1,1} & g_{1,2} & \cdots & g_{1,(K+P)} \\ g_{2,1} & & & \\ \vdots & & G' & \\ g_{(K+P),1} & & & \end{bmatrix}.$$

12. The method of claim 7, further comprising:
    retrieving the feedforward coefficient from a memory according to values of the first sampling rate and the second sampling rate, and wherein retrieving the feedforward coefficient from the memory includes using a lookup table of different feedforward coefficients for converting between different samplings rates to determine the feedforward coefficient.

13. A device comprising:
an infinite impulse response (IIR) filter comprising:
a feedforward circuit coupled to an input, wherein an input signal with a first sampling rate is provided to the feedforward circuit on the input,
a feedback circuit coupled to an output,
a signal combiner coupled to the feedback circuit and the feedforward circuit, wherein the signal combiner generates an output signal and provides the output signal on the output at a second sampling rate,
wherein the feedback circuit is clocked at the second sampling rate and the feedforward circuit is clocked at the first sampling rate, and wherein the IIR filter is configured to recursively and non-uniformly interpolate samples of the output signal by estimating the samples according to a least squares approximation.

14. The device of claim 13, wherein the feedback circuit is configured to generate a feedback value for interpolating a current sample of the output signal based, at least in part, on a predetermined number of previous samples of the output signal and a feedback coefficient.

15. The device of claim 14, wherein the feedback circuit generates the feedback value according to:

$$\sum_{k=1}^{K} a_k y\left(t - \frac{k}{Fs_2}\right)$$

where $a_k$ is the feedback coefficient,
where $Fs_2$ is the second sampling rate,
where t represents a time of a current sample of the output signal that is being interpolated,
where y( ) represents the output signal, and
where k is an integer that represents a previous sample of the output signal.

16. The device of claim 13, wherein the feedforward circuit is configured to generate a feedforward value for interpolating a current sample of the output signal based, at least in part, on (i) samples of the input signal and (ii) a feedforward coefficient.

17. The device of claim 16, wherein the feedforward circuit is configured to generate the feedforward value according to b(t) as represented by:

$$b(t) = \begin{cases} b_{-M}\left(t - \frac{-M}{Fs_1}\right) & \text{for } \frac{-M}{Fs_1} \leq t < \frac{-M+1}{Fs_1} \\ b_{-M+1}\left(t - \frac{-M+1}{Fs_1}\right) & \text{for } \frac{-M+1}{Fs_1} \leq t < \frac{-M+2}{Fs_1} \\ \vdots & \\ b_{M-1}\left(t - \frac{M-1}{Fs_1}\right) & \text{for } \frac{M-1}{Fs_1} \leq t < \frac{M}{Fs_1} \\ 0 & \text{otherwise} \end{cases}$$

$$b(t) = \begin{cases} \sum_{p=0}^{P} c_p t^p & \text{for } \frac{-M}{Fs_1} \leq t < \frac{M}{Fs_1} \\ 0 & \text{otherwise} \end{cases}$$

where $t^p$ is a polynomial of degree P,
where $c_p$ is the feedforward coefficient,
where $Fs_1$ is the first sampling rate,
where t represents a time of a current sample of the output signal that is being interpolated, and
where M is an integer that represents a length of a feedforward channel.

* * * * *